United States Patent
Haukås et al.

(10) Patent No.: US 10,545,261 B2
(45) Date of Patent: Jan. 28, 2020

(54) GEOMECHANICAL MODELING USING DYNAMIC BOUNDARY CONDITIONS FROM TIME-LAPSE DATA

(71) Applicant: WESTERNGECO LLC, Houston, TX (US)

(72) Inventors: Jarle Haukås, Stavanger (NO); Jan Øystein Haavig Bakke, Stavanger (NO); Michael Hermann Nickel, Stavanger (NO); Lars Kristian Sønneland, Stavanger (NO)

(73) Assignee: WESTERNGECO L.L.C., Houston, TX (US)

( * ) Notice: Subject to any disclaimer, the term of this patent is extended or adjusted under 35 U.S.C. 154(b) by 222 days.

(21) Appl. No.: 15/311,432

(22) PCT Filed: May 14, 2015

(86) PCT No.: PCT/US2015/030774
§ 371 (c)(1),
(2) Date: Nov. 15, 2016

(87) PCT Pub. No.: WO2015/175780
PCT Pub. Date: Nov. 19, 2015

(65) Prior Publication Data
US 2017/0082779 A1    Mar. 23, 2017

Related U.S. Application Data

(60) Provisional application No. 61/994,084, filed on May 15, 2014.

(51) Int. Cl.
*G01V 99/00*      (2009.01)
*G06F 17/50*      (2006.01)

(52) U.S. Cl.
CPC ............ *G01V 99/005* (2013.01); *G06F 17/50* (2013.01)

(58) Field of Classification Search
CPC .................... G01V 99/005; E21B 41/0092
See application file for complete search history.

(56) References Cited

U.S. PATENT DOCUMENTS

| | | | |
|---|---|---|---|
| 6,574,563 B1 * | 6/2003 | Nickel | G01V 1/28 702/14 |
| 2005/0149267 A1 * | 7/2005 | Van Den Beukel | G01V 1/30 702/14 |

(Continued)

FOREIGN PATENT DOCUMENTS

WO    WO2014018704 A1    1/2014

OTHER PUBLICATIONS

Hatchell, P. J. et al., "Monitoring reservoir compaction from subsidence and time-lapse timeshifts in the Dan field", BEG Annual Meeting, San Antonio, Texas, USA, 2007, pp. 2867-2871. (Year: 2007).*

(Continued)

*Primary Examiner* — Saif A Alhija
*Assistant Examiner* — Michael Edward Cocchi

(57) ABSTRACT

A method for modelling geomechanical effects in the subsurface by conditioning geomechanical model parameters to time-lapse observations. The model is driven by displacement boundary conditions derived from observed time-lapse travel time shift and time strain. The displacements at the boundaries of the model are extracted from time-lapse data, converted from travel time shift to depth shift and lateral shifts if necessary, and applied as displacement increments on the initial geomechanical model. Subsequently, increments of stresses and strains are calculated by the geomechanical simulator, and time-lapse related parameters in the interior of the model are compared with the time-lapse (Continued)

observations. This enables a comprehensive study of mismatch between simulations and observations that can be used to update material properties, faults, fractures and the rock strain-velocity change relationship (R factor). The updated material properties may be used to make understand subsurface conditions including identifying drilling hazards, well integrity or reservoir integrity.

15 Claims, 10 Drawing Sheets

(56) References Cited

U.S. PATENT DOCUMENTS

| | | | |
|---|---|---|---|
| 2007/0247972 A1* | 10/2007 | Aarre | G01V 1/28 367/38 |
| 2008/0033656 A1 | 2/2008 | Herwanger | |
| 2008/0189043 A1 | 8/2008 | Anno et al. | |
| 2009/0303834 A1* | 12/2009 | Sengupta | G01V 1/303 367/73 |
| 2010/0217563 A1* | 8/2010 | Montaron | E21B 47/00 703/1 |
| 2010/0309749 A1* | 12/2010 | Yogeswaren | G01V 1/28 367/38 |
| 2011/0170373 A1* | 7/2011 | Hsu | G01V 1/282 367/73 |

OTHER PUBLICATIONS

Staples, R. et al., "Monitoring pressure depletion and improving geomechanical models of the Shearwater Field jsing 4D seismic", The Leading Edge, Society of Exploration Geophysicists, 2007, 6 pages. (Year: 2007).*

M. Niebling et al., Detailed Modeling of Injection and Production Induced Rock Displacements, IOR Norway 2017—19th European Symposium on Improved Oil Recovery Apr. 24-27, 2017, Stavanger, Norway, p. 1-10 (Year: 2017).*

Hatchell, P. J. et al., "Measuring reservoir compaction using time-lapse time shifts", SEG Technical Program Expanded Abstracts, Society of Exploration Geophysicists, 2005, pp. 2500-2503 (Year: 2005).*

Hatchell, P. J. et al., "Measuring reservoir compaction using time-lapse time shifts", SEG Technical Program Expanded Abstracts, Society of Exploration Geophysicists, 2005, pp. 2500-2503.

Hatchell, P. J. et al., "Monitoring reservoir compaction from subsidence and time-lapse timeshifts in the Dan field", SEG Annual Meeting, San Antonio, Texas, USA, 2007, pp. 2867-2871.

Hatchell, P. J. et al., "Rocks under strain: Strain-induced time-lapse time shifts are observed for depleting reservoirs", The Leading Edge, 2005, 24(12), pp. 1244-1248.

Nickel, M. et al., "Non-rigid matching of migrated time-lapse seismic", European Association of Geoscientists and Engineers, 1999, Seg Technical Program Expanded Abstracts, Society of Exploration Geophysicists, pp. 872-875.

Smith, S. S. et al., "Sensitivity of compaction-induced multicomponent seismic time shifts to variations in reservoir properties", Geophysics, 2013, 78(5), pp. T151-T163.

Staples, R. et al., "Monitoring pressure depletion and improving geomechanical models of the Shearwater Field using 4D seismic", The Leading Edge, Society of Exploration Geophysicists, 2007, 6 pages.

Tura, A. et al., "Monitoring primary depletion reservoirs using amplitudes and time shifts from high-repeat seismic surveys", The Leading Edge, Society of Exploration Geophysicists, 2005, 24(12), 8 pages.

Article 94(3) Exam Report of European Patent Application No. 15792158.6 dated Dec. 4, 2017, 8 pages.

Search Report of European Patent Application No. 15792158.6 dated Nov. 7, 2017, 3 pages.

Search Report and Written Opinion of International Patent Application No. PCT/US2015/030774 dated Jul. 31, 2015, 8 pages.

International Preliminary Report on Patentability of International Patent Application No. PCT/US2015/030774, dated Nov. 24, 2016, 7 pages.

* cited by examiner

GEOMECHANICAL MODELING USING DYNAMIC BOUNDARY CONDITIONS FROM TIME-LAPSE DATA

CROSS-REFERENCE TO RELATED APPLICATION

This application claims benefit of U.S. Provisional Patent App. Ser. No. 61/994,084 filed May 15, 2014, which is herein incorporated by reference in its entirety.

BACKGROUND

This disclosure relates to geomechanical modeling, and, in particular, relates to use dynamic boundary conditions from time-lapse seismic data to update or refine the geomechanical model.

Geomechanical modelling of the subsurface can be used to study the stresses and strains introduced by injection and production. A proper understanding of the stresses and strains is necessary to avoid drilling hazards, maximize recovery and ensure reservoir integrity.

Time-lapse seismic data may provide information about the dynamic behavior of the subsurface between two seismic surveys, including density and velocity change and displacement of seismic events. Inversion may be used to relate the time-lapse changes to changes in rock properties, pressure, temperature, saturation and rock displacements.

Changes in the subsurface imply modified stresses and strains in and around the location where the changes occur. In the geomechanical simulation model, the modified stress and strain state is typically governed by a stress increment or a displacement increment applied to the model. Stress increments may be derived from changes in pressure, temperature and saturation, whereas displacement increments derived from time-lapse seismic data have not been studied widely.

Estimates of actual rock displacements from time-lapse seismic displacements rely on estimates of the velocity of the rock and how rock displacements modify the velocity. A commonly used approximation of the relationship between relative velocity change and actual rock strain is the R factor (Hatchell and Bourne, 2005a, 2005b), defined by $$\frac{\delta v}{v} = -R\varepsilon_{zz}.$$

Here $\delta v/v$ is the relative velocity change, while $\varepsilon_{zz}$ is the vertical strain. Assuming that the changes are small, the relative change in two-way travel time, referred to as the time strain, can then be expressed as $$\frac{d}{dt}(\delta t) = 2\left(\varepsilon_{zz} - \frac{\delta v}{v}\right) = (1+R)\varepsilon_{zz}.$$

The two-way travel time shift measured from time-lapse seismic data is an effect of accumulated time strain. An estimate of the R factor is required to convert the two-way travel time shift to an estimate of the actual rock displacement.

An important goal of geomechanical modeling is to use the mismatch between simulation results and time-lapse observations to update the material properties, the fault/fracture model and/or the model of the rock strain-velocity change relationship. A properly calibrated geomechanical model can be used for predictions. In addition, results from geomechanical modeling may help in interpreting time-lapse data.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In accordance with one embodiment of the present disclosure, a new workflow for modelling geomechanical effects in the subsurface and conditioning the geomechanical model parameters to time-lapse observations is provided. The model is driven by displacement boundary conditions derived from observed time-lapse travel time shift and time strain. The displacements at the boundaries of the model are extracted from time-lapse data, converted from travel time shift to depth shift and/or lateral shifts, and applied as displacement increments on the initial geomechanical model. In some aspects, increments of stresses and strains are calculated by the geomechanical simulator, and time-lapse related parameters in the interior of the model may be compared with the time-lapse observations. Embodiments of the present disclosure may enable a comprehensive study of mismatch between simulations and observations that may be used to update material properties, faults, fractures and the rock strain-velocity change relationship (R factor). In accordance with some embodiments of the present disclosure, the boundary condition approach provides that the geomechanical model of the rock surrounding a reservoir can be decoupled from the history matching of the reservoir model. This makes the analysis and history matching of the geomechanical model, in accordance with such embodiments, simpler and more accurate.

One of the methods according to an embodiment of the current invention includes building a geomechanical model of a volume of interest; obtaining a pair of time-lapse seismic cubes of the volume of interest and calculating a shift to align events in the seismic cube; estimating the actual vertical displacement at the boundaries; running the geomechanical simulator with the displacement derived from last step as a displacement increment; comparing simulated displacement and strain with the time-lapse observation; updating an R factor or model and repeating one or more steps until convergence. The geomechanical model may be in 3-dimensional (3D), 2D or 1D.

BRIEF DESCRIPTION OF DRAWINGS

Embodiments of this disclosure are described with reference to the following figures. The same numbers are used throughout the figures to reference like features and components. A better understanding of the methods or apparatuses can be had when the following detailed description of the several embodiments is considered in conjunction with the following drawings, in which.

DETAILED DESCRIPTION

Reference will now be made in detail to embodiments, examples of which are illustrated in the accompanying drawings and figures. In the following detailed description, numerous specific details are set forth in order to provide a thorough understanding of the subject matter herein. However, it will be apparent to one of ordinary skill in the art that the subject matter may be practiced without these specific details. In other instances, well-known methods, procedures, components, and systems have not been described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first object or step could be termed a second object or step, and, similarly, a second object or step could be termed a first object or step. The first object or step, and the second object or step, are both objects or steps, respectively, but they are not to be considered the same object or step.

The terminology used in the description of the disclosure herein is for the purpose of describing particular embodiments only and is not intended to be limiting of the subject matter. As used in this description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Figure 1:
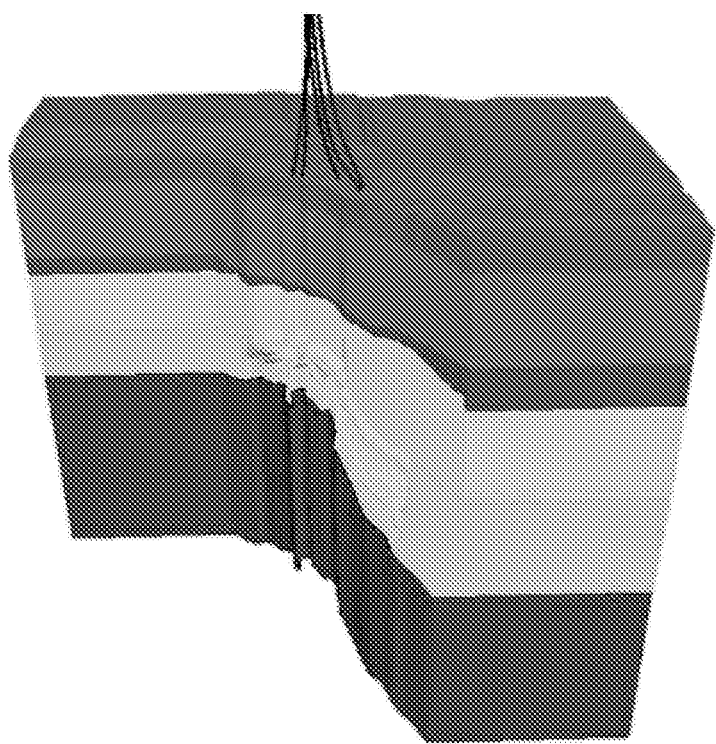
FIG. 1 illustrates a 3D geomechanical model with horizons, faults, fractures and material properties.
Figure 2:
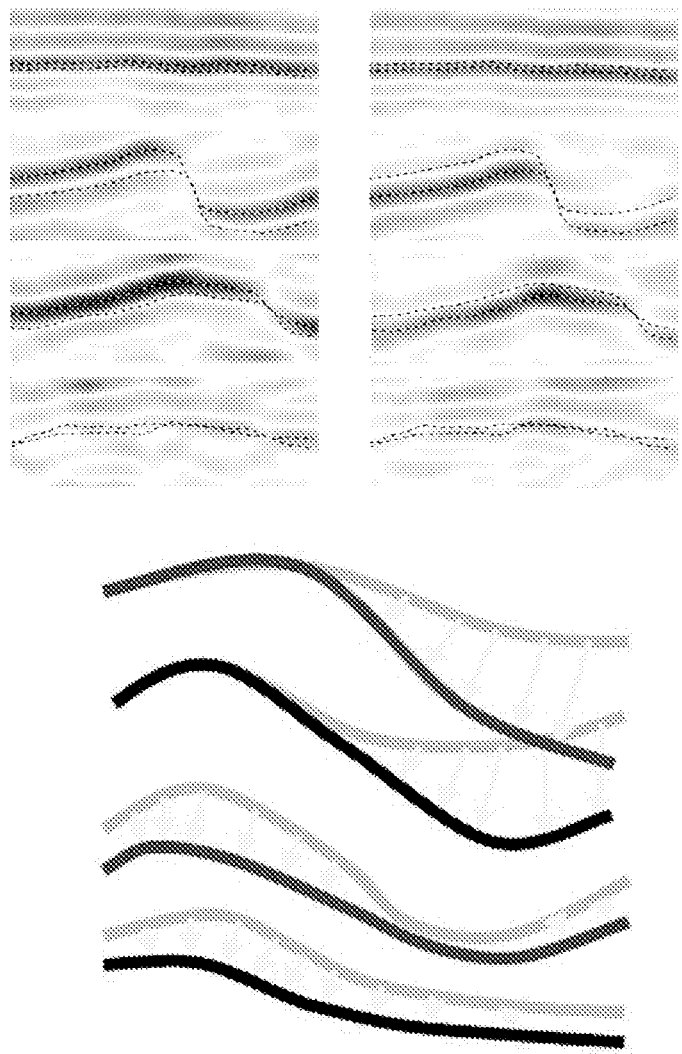
FIG. 2 illustrates time shifts: the events identified by dotted lines in the seismic images to the left are visibly shifted in the time-lapse seismic images to the right. The Non-rigid matching algorithm is used to calculate the 3D shift (bottom).
Figure 3:
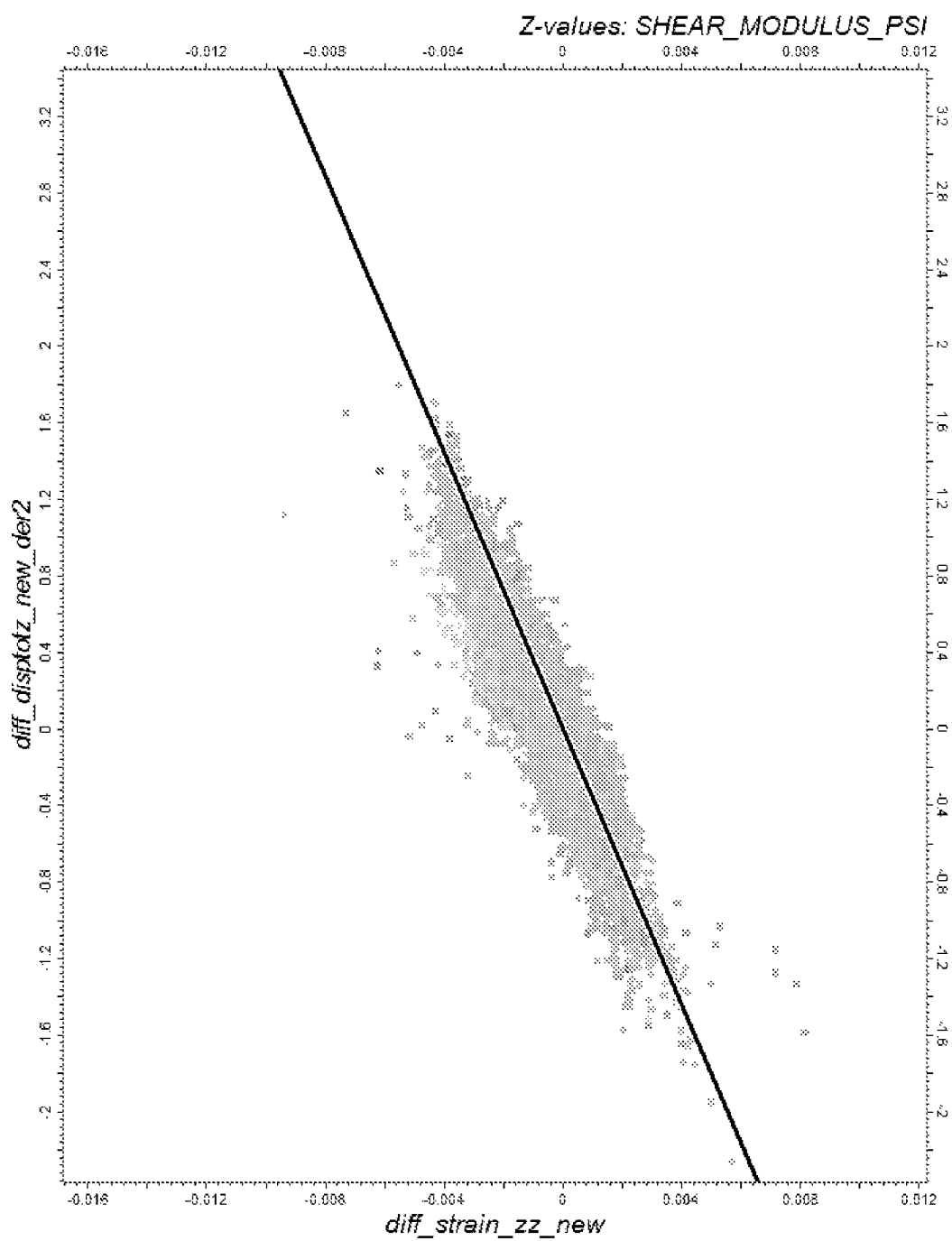
FIG. 3 illustrates a chart of determining the factor α from simulation results (Laplacian of displacement vs vertical strain).
Figure 4:
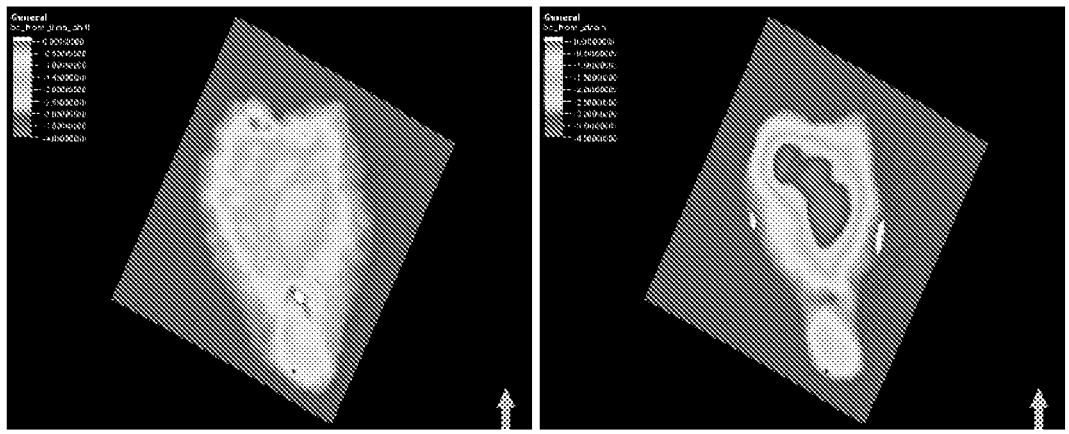
FIG. 4 illustrates a comparison of actual displacement estimated from time shift (left) versus actual displacement estimated from time strain (right).
Figure 14:
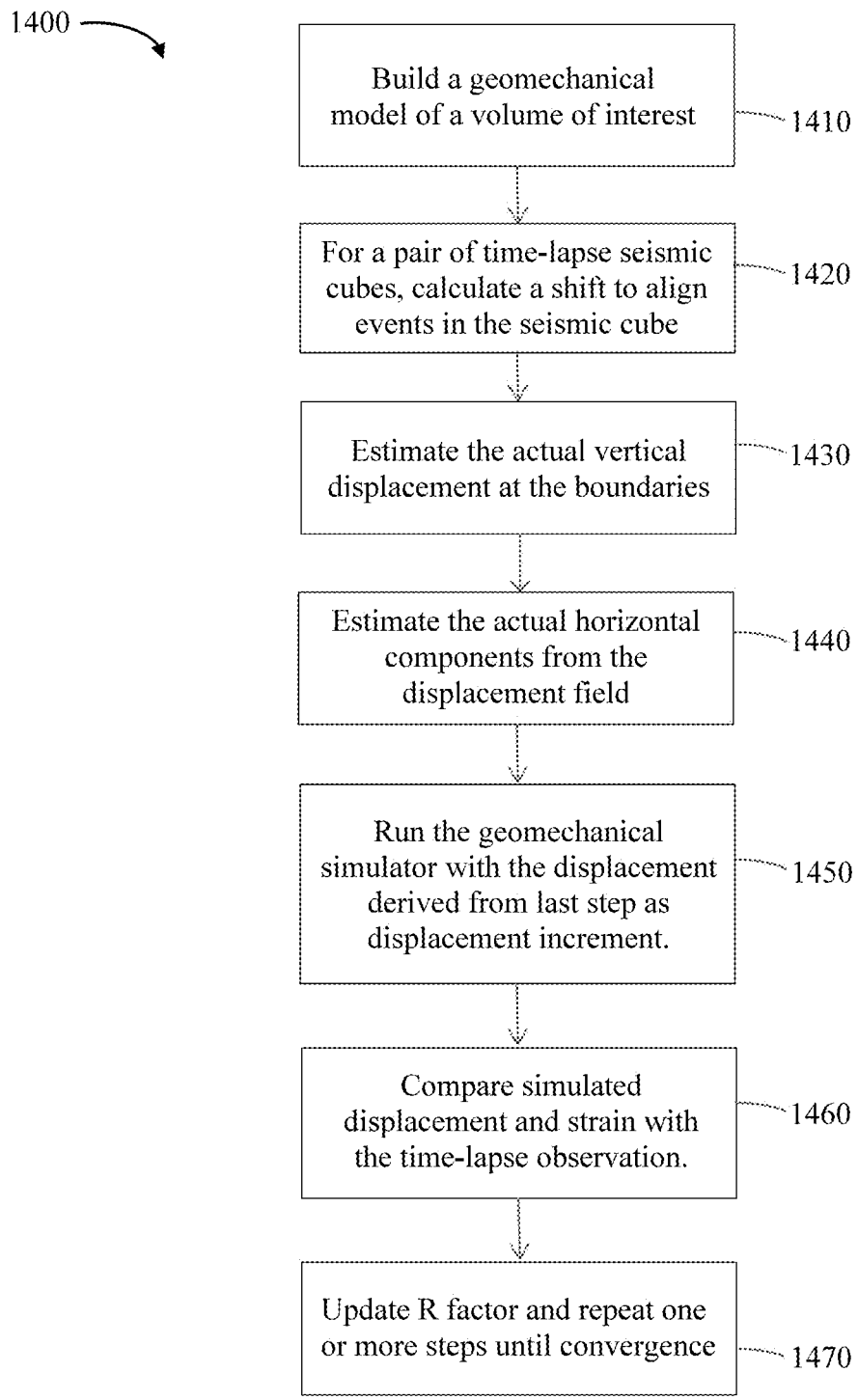
FIG. 14 illustrates a work flow chart for geomechanical modeling, in accordance with an embodiment of the present invention.

FIG. 14 illustrates a workflow 1400 where:

(1) In step 1 (1410) a geomechanical model of the volume of interest is built (see FIG. 1). The geomechanical model may comprise a 1D, 2D or 3D model. The model geometry is configured to be consistent with horizons and faults from seismic data, appropriately converted to depth. Material properties are assigned to the cells/elements in the model (elastic properties and properties governing the plastic behavior), using available information, e.g., well logs, core measurements, seismic inversion, etc. A geomechanical simulation is used to determine the initial stresses, displacements and strains in the model;

(2) For a plurality of time-lapse seismic cubes, in step 2 (1420) a shift is calculated that is necessary to align the events in the seismic cubes (see FIG. 2). For example, in a 3D model, the shift is a 3D shift. One algorithm for calculating the 3D shift in accordance with the present disclosure is Non-Rigid Matching (See Nickel et al., U.S. Pat. No. 6,574,563). For the 3D case, the observed 3D shift is the sum of a 3D displacement field associated with the velocity change between the surveys, and a 3D displacement field associated with the actual rock displacements. From the travel time shift, which is the vertical component of the 3D shift, the vertical derivative may be used to calculate the time strain;

(3) In step 3 (1430) the actual displacement occurring between the time-lapses at the boundaries of the model is estimated. The actual displacement may be determined by applying one or more of following relationships:

$$\delta z_K = \delta z_{SB} + \sum_{k=SB}^{K} \frac{v_k}{2(1+R_k)} \Delta \delta t_k$$

$$\delta z_K = \frac{v_w}{2} \delta t_{SB} + \sum_{k=SB}^{K} \frac{v_k}{2(1+R_k)} \Delta \delta t_k$$

$$\delta z_K = \frac{\overline{v}}{2(1+\overline{R})} \delta t_K + \left(1 - \frac{\overline{v}}{v_w(1+\overline{R})}\right) \delta z_{SB}$$

$$\delta z_K = \frac{\overline{v}}{2(1+\overline{R})} \delta t_K + \left(\frac{v_w}{2} - \frac{\overline{v}}{2(1+\overline{R})}\right) \delta t_{SB}$$

$$\nabla^2 \delta z_K = \frac{\alpha_K}{2(1+R_K)} \frac{d}{dt} \delta t_K$$

where:

$\delta z$ is actual vertical displacement, $\delta t$ is time shift, $v$ is velocity and $R$ is the R factor;

subscript K indicates the depth level where displacement is estimated;

subscript k indicates a layer between the seabed and the level of interest;

subscript SB indicates a measurement at the seabed;

the bar denotes a representative value between the seabed and the level of interest;

the factor α is the ratio between the differential slope of the displacement and the vertical strain, which is a constant for each layer if the assumptions of simple plate theory hold (the factor α is material property dependent, and can be derived from geomechanical simulation results, see FIG. 3);

the operator $\nabla^2$ is the Laplacian (sum of lateral second order derivatives), and the time derivative of the time shift is the time strain; and the first four relationships provide an estimate of actual displacement from time shift, while the last relationship gives an estimate based on time strain (see FIG. 4).

Note, the vertical (and potentially also horizontal) displacement to be applied at the boundary of the geomechnical model may be generated by reading the estimated (from the time lapse seismic cubes) shift at the location of the boundary and correcting these values for the "velocity change effect" by dividing by (1+R_average). Where, this R_average may have to be guessed, estimated and/or extrapolated from subsidence measurements by e.g. well logs and/or possibly tilt-meters. The methods in accordance with aspects of the present disclosure then goes on and estimates local R factors (cell by cell, lithological layer by lithological layer). These local R factors are material dependent i.e. a material property. Furthermore, they may be state dependent as well and are the proportionality factor of the linearization of a nonlinear curve around the working point (state).

Figure 5:
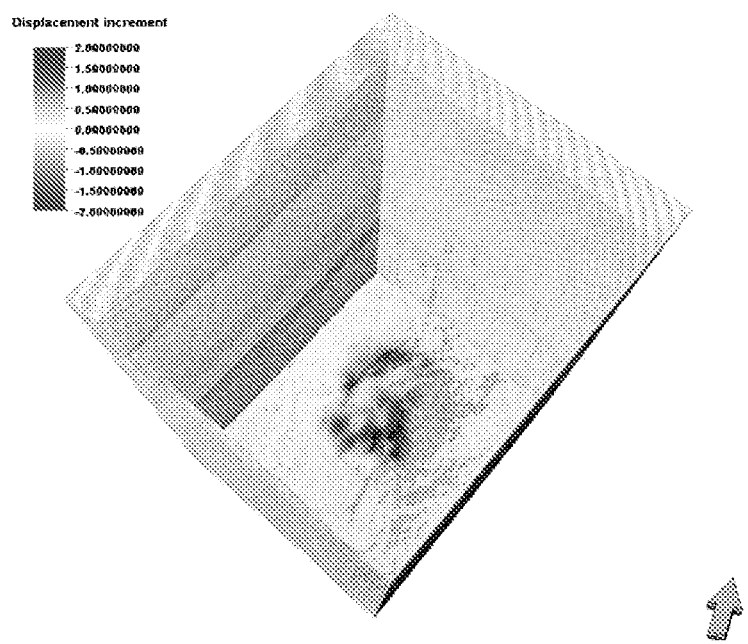
FIG. 5 illustrates a displacement increment as points with attributes.
Figure 6:
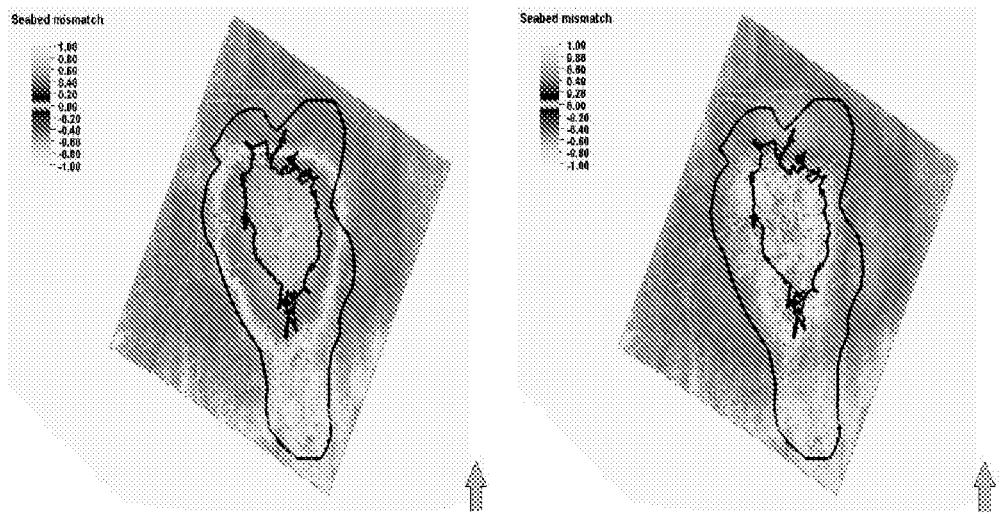
FIG. 6 illustrates seabed subsidence mismatch before boundary condition update (left) and after update (right).

After the local R factors are estimated, the R average factor may be calculated and updated. Under the right conditions, the R average does not change and the process converges to a value where the R factors are the final result. These R factors can then be used to predict future stress states of the subsurface;

(4) Optionally, in step (4) (1440) actual horizontal displacements are estimated from the horizontal components of the displacement field calculated in Step 1. Alternatively, from some relationship between a vertical displacement and a horizontal displacement, the horizontal displacement can be estimated;

(5) In step 5 (1450) a geomechanical simulator is run with the displacements derived in Step 3 and/or Step 4 as displacement increments on the initial state described in Step 1 (see FIG. 5);

(6) In step 6 (1460), simulated displacements and strains are compared with the time-lapse observations. The material model is updated, i.e., the faults, fractures, and/or the R factor model to reduce the mismatch. The mismatch analysis may include one or more of the following steps:

a. Leave some part of the boundary without displacement constraints. If there exist additional measurements of the displacement at this part of the boundary, e.g. surface subsidence measurements or seabed subsidence measurements from bathymetry data, the mismatch can be analyzed. FIG. 6 illustrates seabed subsidence mismatch analysis.

b. Compare observed time shift and simulated time shift, both in 1D, 2D and 3D (see FIG. 7, FIG. 8 and FIG. 9). Do the same comparison for time strain (see FIG. 10). Identify whether the mismatch is related to material properties, faults/fractures or the strain-velocity change relationship (R factor). Evaluate if the time shift measured from the time-lapse data is sufficiently smooth to be compared to the simulation results, or if averaging is necessary. This step may also reveal problems in processing the seismic data, e.g., if unphysical time strain has been introduced.

c. Calculate the R factors required for the simulated strain and observed time strain to be equal, using the relationship below.

$$R_k = \frac{\frac{d}{dt}\delta t}{\varepsilon_{zz}} - 1$$

Figure 11:
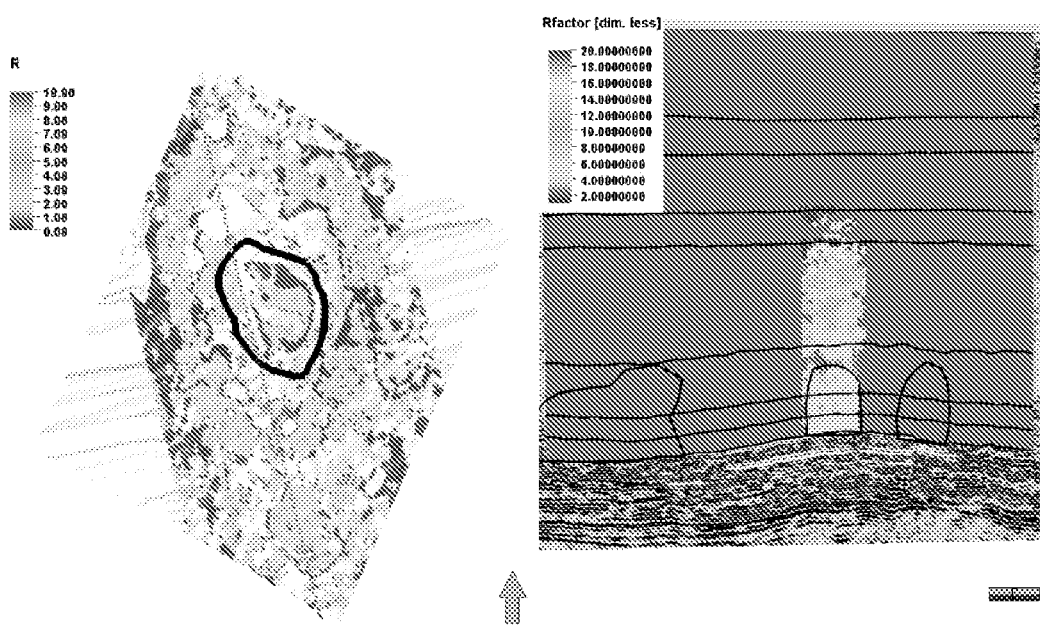
FIG. 11 illustrates an example of R factor estimate: for a layer (left), intersection view (right).

FIG. 11 illustrates a result of the R factor calculation.

d. Compare the Laplacian of time shift/displacement to simulated strain/time strain (see FIG. 12). If the assumptions in simple plate behavior are valid, the Laplacian and the strains should be proportional. Identify regions where the assumptions seem valid and regions where the assumptions seem invalid.

e. Compare transition regions between compaction and dilation against reported well problems (see FIG. 13). Evaluate whether well problems may be caused by shear forces, and whether model should be updated to match the regions of well problems; and (7) In step 7 (1470), if the analysis leads to a modification of the R factor, the method goes back to Step 3 and uses the updated R factor to calculate a new displacement boundary condition. If material properties, faults or fractures are updated, the model is re-run and the method goes back to Step 6 for further analysis.

Note, the steps may be performed in different order and individual steps may be optional. During the first five steps, the seismic time-lapse data may be used to find the time shift which is used to confine the boundaries of the geomechanical model. Step 6 (1460) may be used to compare simulated properties from the model in the interior volume (not the boundaries) and those from the time-lapse observation for the same volume. In some aspects, the mismatches may be analyzed for their causes.

Once a refined model is made from the above work flow, the model may be used for many different application, including, for example:

making time shift estimates more physically reasonable by comparing results of simulation runs with observed time shifts, and introducing adaptive smoothing/averaging of the observed time shifts that takes into account the expected trends from the simulation;

identifying processing artifacts, where if mismatches found in the method are physically unreasonable, they may be identified as processing artifacts and can be removed, which can improve the processing methods and the resulting data quality;

estimating a relationship between strain and velocity change (R factors) by estimating the R factor locally from comparisons of time strain and simulated strain. This is done for multiple time-lapses so that when a consistent R factor is found, time strain may be converted into actual strain, which allows the method to be used for quantitative analysis of drilling hazards, well integrity and reservoir integrity. A realistic and credible estimate of R factor is an extremely useful result from the above work flow; and updating material properties/third order elasticity parameters using the R factors from the method using their relation to material parameters (density and velocity) through third order elasticity constants. In this analysis, an estimate of R may be used to estimate other material properties, for example, the third order elasticity constants consistent with density and velocity data. If the resulting estimates are unrealistic/unreasonable, the material properties are updated and the model is rerun.

FIGS. 1-13 illustrate several examples using the methods discussed above. For example:

FIG. 1 illustrates a 3D geomechanical model with horizons, faults, fractures and material properties;

FIG. 2 illustrates time shifts where events identified by dotted lines in the seismic images are visibly shifted in the time-lapse seismic images. A non-rigid matching algorithm, in accordance with the present application, is used to calculate the 3D shift in the bottom illustration.

Figure 7:
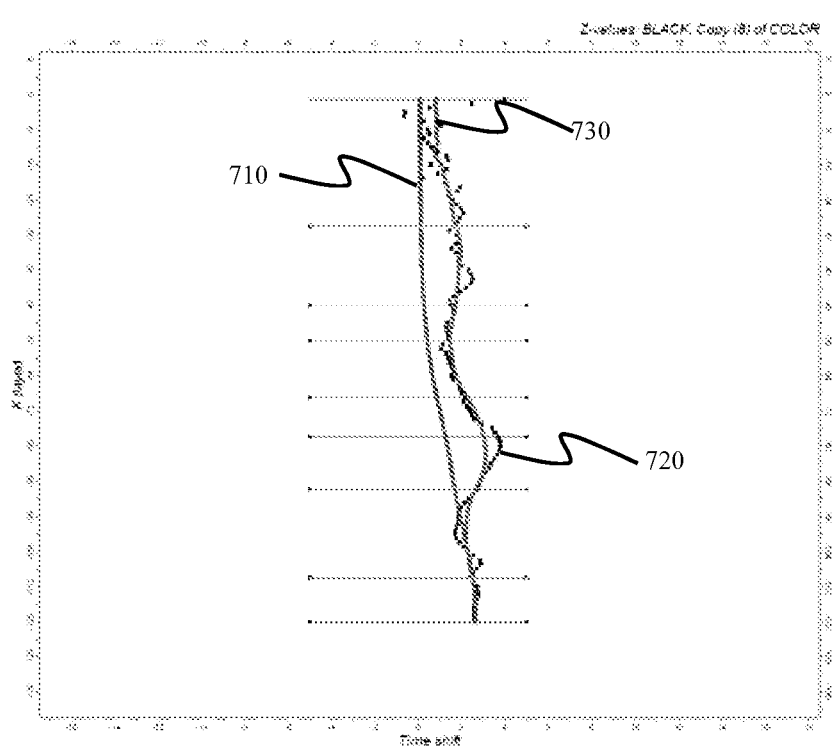
FIG. 7 illustrates a 1D time shift comparison: simulated (blue) versus observed time shift (black) and averaged observed time shift (red) along a trace/grid column.
Figure 8:
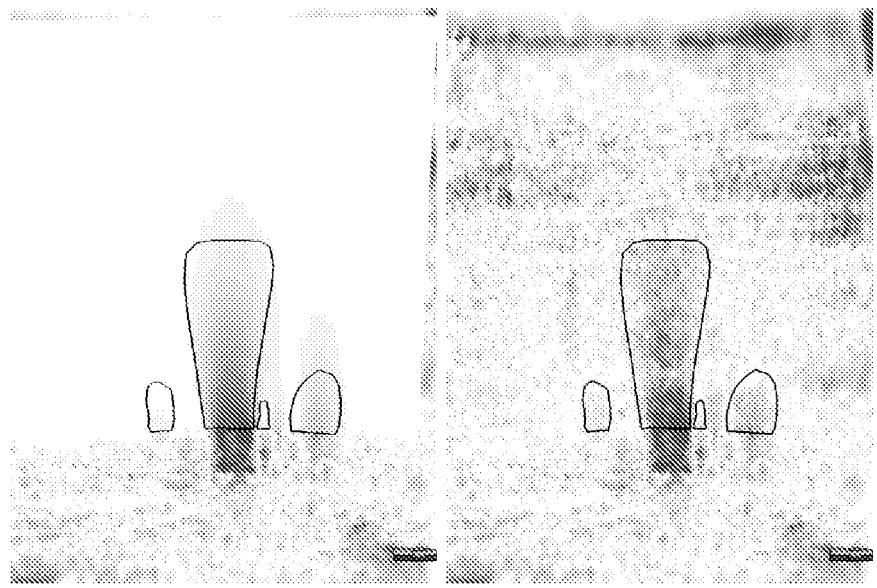
FIG. 8 illustrates a 2D time shift comparison: simulated time shift (left) versus observed time shift (right).
Figure 9:
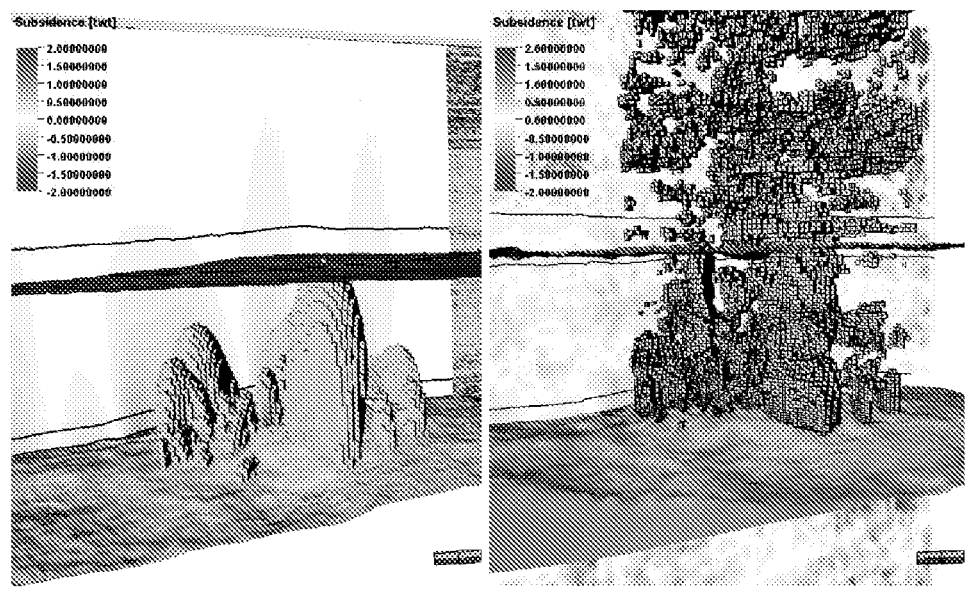
FIG. 9 illustrates a 3D time shift comparison: thresholded simulated time shift (right) versus thresholded observed time shift (right).
Figure 10:
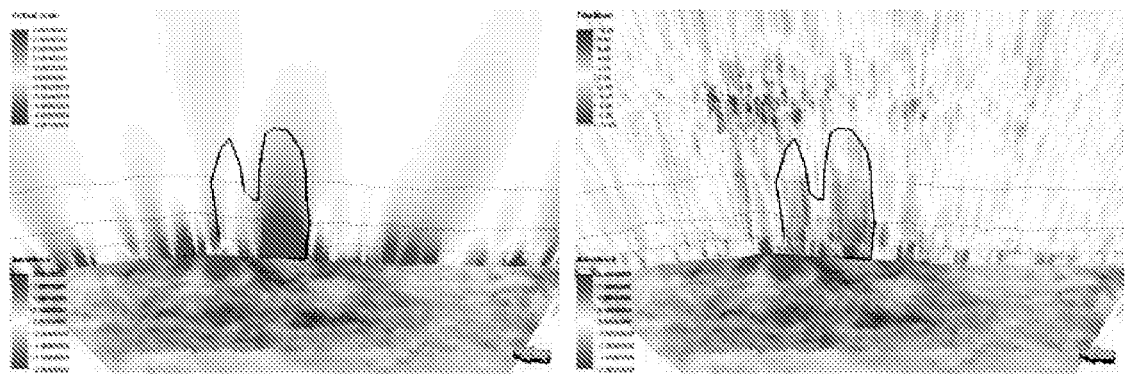
FIG. 10 illustrates a comparison of simulated versus observed time strain.
Figure 12:
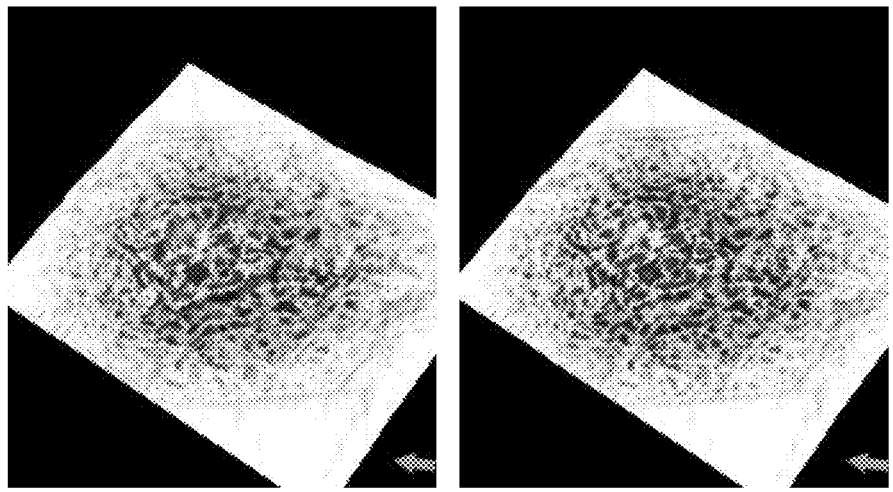
FIG. 12 illustrates a simulated strain (left) and Laplacian of displacement (right).
Figure 13:
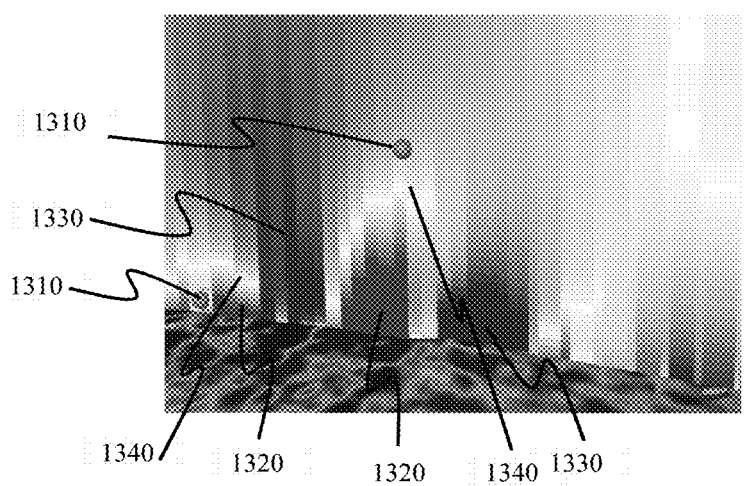
FIG. 13 illustrates a chart of well collapse location (blue point) co-visualized with simulated strain—red indicates compaction, blue indicates dilation, and white indicates transition zones where strong shear forces may occur.

FIG. 3 illustrates determining the factor $\alpha$ from simulation results (Laplacian of displacement vs vertical strain);

FIG. 4 illustrates actual displacement estimated from time shift (left image) versus actual displacement estimated from time strain (right image);

FIG. 5 illustrates the displacement increment as points with attributes. In this example, the only non-zero displacements are at the base of the model (top reservoir). The displacement increments at the sides are set to zero, while the displacement at the top (seabed) is unconstrained so that simulated displacements can be compared against bathymetry data;

FIG. 6 illustrates the seabed subsidence mismatch before boundary condition update (left image) and after update (right image);

FIG. 7 illustrates a 1D time shift comparison: simulated (blue) 710 versus observed time shift (black) 720 and averaged observed time shift (red) 730 along a trace/grid column;

FIG. 8 illustrates a 2D time shift comparison: simulated time shift (left image) versus observed time shift (right image);

FIG. 9 illustrates a 3D time shift comparison: thresholded simulated time shift (right image) versus thresholded observed time shift (left image);

FIG. 10 illustrates simulated time strain versus observed time strain;

FIG. 11 illustrates an example of an R factor estimate for a layer (left image) and an intersection view (right image);

FIG. 12 illustrates simulated strain (left image) and Laplacian of displacement (right image); and FIG. 13 illustrates a well collapse location (blue points) 1310 co-visualized with simulated strain—red regions 1320 indicating compaction, blue regions 1330 indicating dilation, and white region 1340 indicating transition zones where strong shear forces may occur.

As those with skill in the art will understand, one or more of the steps of methods discussed above may be combined, steps may be optional and/or the order of some operations may be changed. Further, some operations in methods may be combined with aspects of other example embodiments disclosed herein, and/or the order of some operations may be changed. The process of measurement, its interpretation, and actions taken by operators may be done in an iterative fashion; this concept is applicable to the methods discussed herein.

Figure 15:
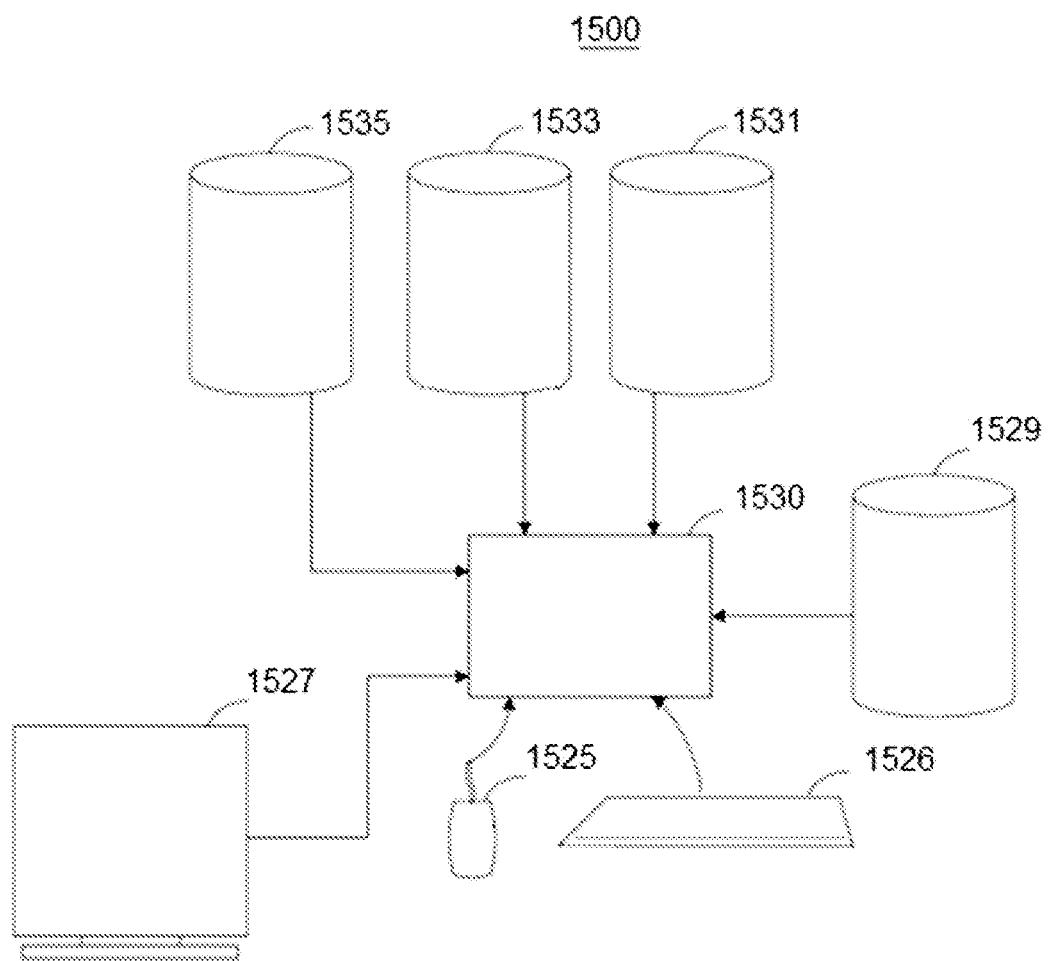
FIG. 15 illustrates a computer system that may implement one of methods of this application.

FIG. 15 illustrates a computing system 1500 for performing the method described herein. The system computer 1530 may be in communication with disk storage devices 1529, 1531, 1533 and 1535, which may be external hard disk storage devices. It is contemplated that disk storage devices 1529, 1531, 1533 and 1535 are conventional hard disk drives, and as such, will be implemented by way of a local area network or by remote access. Of course, while disk storage devices are illustrated as separate devices, a single disk storage device may be used to store any and all of the program instructions, measurement data, and results as desired.

In one implementation, data may be stored in disk storage device 1531. Various data from different sources may be stored in disk storage device 1533. The system computer 1530 may retrieve the appropriate data from the disk storage devices 1531 or 1533 to process data according to program instructions that correspond to implementations of various techniques described herein. The program instructions may be written in a computer programming language, such as C++, Java and the like. The program instructions may be stored in a computer-readable medium, such as program disk storage device 1535. Such computer-readable media may include computer storage media. Computer storage media may include volatile and non-volatile, and removable and non-removable media implemented in any method or technology for storage of information, such as computer-readable instructions, data structures, program modules or other data. Computer storage media may further include RAM, ROM, erasable programmable read-only memory (EPROM), electrically erasable programmable read-only memory (EEPROM), flash memory or other solid state memory technology, CD-ROM, digital versatile disks (DVD), or other optical storage, magnetic cassettes, magnetic tape, magnetic disk storage or other magnetic storage devices, or any other medium which can be used to store the desired information and which can be accessed by the system computer 1530. Combinations of any of the above may also be included within the scope of computer readable media.

In one implementation, the system computer 1530 may present output primarily onto graphics display 1527, or alternatively via printer 1528 (not shown). The system computer 1530 may store the results of the methods described above on disk storage 1529, for later use and further analysis. The keyboard 1526 and the pointing device (e.g., a mouse, trackball, or the like) 1525 may be provided with the system computer 1530 to enable interactive operation.

The system computer 1530 may be located at a data center remote from an exploration field. The system computer 1530 may be in communication with equipment on site to receive data of various measurements. The system computer 1530 may also be located on site in a field to provide faster feedback and guidance for the field operation. Such data, after conventional formatting and other initial processing, may be stored by the system computer 1530 as digital data in the disk storage 1531 or 1533 for subsequent retrieval and processing in the manner described above. While FIG. 15 illustrates the disk storage, e.g. 1531 as directly connected to the system computer 1530, it is also contemplated that the disk storage device may be accessible through a local area network or by remote access. Furthermore, while disk storage devices 1529, 1531 are illustrated as separate devices for storing input data and analysis results, the disk storage devices 1529, 1531 may be implemented within a single disk drive (either together with or separately from program disk storage device 1533), or in any other conventional manner as will be fully understood by one of skill in the art having reference to this specification.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the invention. Accordingly, the protection sought herein is as set forth in the claims below.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

REFERENCES

Hatchell, P. J., and Bourne, S. J., 2005a. Measuring reservoir compaction using time-lapse time shifts. $75^{th}$ Annual International Meeting. Society of Exploration Geophysicists, 2500-2503.

Hatchell, P. J., and Bourne, S. J., 2005b. Rocks under strain: Strain-induced time-lapse time shifts are observed for depleting reservoirs. The Leading Edge, 24 (12), 1244-1248.

Nickel, M., and Sonneland, L. 1999 . Non-rigid matching of migrated time-lapse seismic. *European Association of Geoscientists and Engineers, Extended Abstracts.*

U.S. Pat. No. 6,574,563

What is claimed is:

1. A method for characterizing a subsurface volume of interest, the method comprising:
    performing an injection operation in a reservoir;
    building a geomechanical model of a volume of interest of said reservoir;
    processing at least two time-lapse seismic cubes, wherein the at least two time-lapse seismic cubes are either from or within the volume of interest;
    determining a shift to align one or more events in a first of the at least two time-lapse seismic cubes with one or more events in a second of the at least two time-lapse seismic cubes;
    processing a displacement at a boundary of the geomechanical model from the determined shift, the displacement at the boundary being generated by reading the determined shift at the boundary and correcting for a velocity change effect by dividing by 1+R_average, where R_average is an average of local R factors for the geomechanical model, wherein the local R factors are estimated on one or more of a cell by cell basis or a lithological layer by lithological layer basis;
    obtaining a simulated displacement and/or a simulated strain from a geomechanical simulator for parts of the geomechanical model where time-lapse shifts are available using the displacement at the boundary as a displacement increment;
    comparing the simulated displacement and/or the simulated strain with time lapse observations, wherein the time lapse observations comprise one or more of a time shift or a time strain;
    using the comparison between the simulated displacement and/or the simulated strain and the time lapse observations to update respective R factors for the geomechanical model, wherein the R factors comprise a relationship between relative velocity change and rock strain; and
    repeating one or more of the preceding steps until at least one of the simulated displacement and/or the simulated strain converges to at least one of the time shift or the time strain, respectively.

2. The method of claim 1, wherein the simulated displacement and/or the simulated strain are converted to a simulated time strain and/or a simulated time shift.

3. The method of claim 2, wherein the R factors are used to convert the simulated strain to the simulated time strain.

4. The method of claim 3, wherein the simulated time strain is summed/accumulated to process the simulated time shift.

5. The method of claim 1, wherein the at least two time-lapse seismic cubes comprise seismic cubes occupying a same location in the volume of interest at different temporal locations.

6. The method of claim 1, further comprising: using at least one of the simulated displacement, the simulated strain, or the R factors to determine drilling hazards, well integrity, or reservoir integrity.

7. A method for characterizing a subsurface volume of interest, the method comprising:
    performing an injection operation in a reservoir;
    building a geomechanical model of a volume of interest of said reservoir;
    processing a plurality of time-lapse seismic cubes from/within the volume of interest;
    determining a travel time shift to align one or more events in at least a first of the plurality of time-lapse seismic cubes and one or more events in at least a second of the plurality of time-lapse seismic cubes;
    processing a displacement at a boundary of the geomechanical model from the determined travel time shift, the displacement at the boundary being generated by reading the determined travel time shift at a location of the boundary and correcting for a velocity change effect by dividing by 1+R_average, where R_average is an average of local R factors for the geomechanical model, wherein the local R factors are estimated on one or more of a cell by cell basis or a lithological layer by lithological layer basis;
    obtaining a simulated displacement and/or a simulated strain from a geomechanical simulator using the displacement as a displacement increment;
    comparing the simulated displacement and/or the simulated strain with time lapse observations, wherein the time lapse observations comprise one or more of a time shift or a time strain; and
    using the comparison to update the geomechanical model.

8. The method of claim 7, wherein the geomechanical model is repeatedly updated until an output of the geomechanical model matches or converges upon the time lapse observations.

9. The method of claim 7, further comprising:
    using the updated geomechanical model to determine drilling hazards, well integrity, or reservoir integrity.

10. The method of claim 7, wherein the plurality of time-lapse seismic cubes comprise seismic cubes processed after a succession of time intervals.

11. A computer implemented method comprising: performing an injection operation in a reservoir;
building a geomechanical model of a volume of interest of said reservoir;
obtaining a pair of time-lapse seismic cubes of the volume of interest and calculating a shift to align events in the seismic cubes;
estimating an actual vertical displacement at a set of boundaries by reading the shift at the set of boundaries and correcting for a velocity change effect by dividing by 1+R_average, where R_average is an average of local R factors for the geomechanical model, wherein the local R factors are estimated on one or more of a cell by cell basis or a lithological layer by lithological layer basis;
running a geomechanical simulator with the actual vertical displacement derived from the estimating step as a displacement increment;
comparing a simulated vertical displacement and a simulated strain with a time-lapse observation;
updating at least one of the R factors for the geomechanical model and re-calculating R_average; and
repeating one or more steps until the simulated vertical displacement and simulated strain converge with the time-lapse observation.

12. The method of claim 11, wherein the R factors are determined from the convergence of the simulated vertical displacement and simulated strain with the time-lapse observation.

13. The method of claim 11, further comprising: using at least one of the simulated vertical displacement, the simulated strain, or the R factors to determine drilling hazards, well integrity, or reservoir integrity.

14. The method of claim 8, further comprising:
using the updated geomechanical model to determine drilling hazards, well integrity, or reservoir integrity.

15. The method of claim 12, further comprising: using at least one of the simulated vertical displacement, the simulated strain, or the R factors to determine drilling hazards, well integrity, or reservoir integrity.

* * * * *